United States Patent
Tseng et al.

(10) Patent No.: US 9,575,346 B2
(45) Date of Patent: Feb. 21, 2017

(54) SUPPORT DEVICE FOR A DISPLAY DEVICE

(71) Applicant: HON HAI PRECISION INDUSTRY CO., LTD., New Taipei (TW)

(72) Inventors: Chien-Yu Tseng, New Taipei (TW); Chih-Huang Lien, New Taipei (TW); Chen-Jung Fang, New Taipei (TW); Hui-Ting Shen, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 85 days.

(21) Appl. No.: 14/590,155

(22) Filed: Jan. 6, 2015

(65) Prior Publication Data

US 2016/0143167 A1 May 19, 2016

(30) Foreign Application Priority Data

Nov. 19, 2014 (TW) .............................. 103139984 A

(51) Int. Cl.
*H05K 5/02* (2006.01)
*G02F 1/1333* (2006.01)

(52) U.S. Cl.
CPC ....... *G02F 1/133308* (2013.01); *H05K 5/0234* (2013.01); *H05K 5/0247* (2013.01)

(58) Field of Classification Search
CPC .. H05K 5/0234; H05K 5/0017; H05K 5/0221; H05K 5/0247; H05K 5/02; H05K 5/00; F16M 11/00; F16M 11/04; E04H 12/22
USPC .......... 248/125.7, 125.9, 121, 128, 131, 415
See application file for complete search history.

(56) References Cited

U.S. PATENT DOCUMENTS

| | | | | |
|---|---|---|---|---|
| 2,999,149 A * | 9/1961 | Cook, Jr. | ................ | B63B 45/00 116/173 |
| 4,523,732 A * | 6/1985 | Biber | ..................... | F16M 11/04 248/123.11 |
| 6,095,468 A * | 8/2000 | Chirico | .................. | F16M 11/04 248/125.7 |
| 7,651,059 B2 * | 1/2010 | White | ..................... | H02G 1/04 182/2.11 |
| 8,020,816 B2 * | 9/2011 | Laitila | .................... | F16M 13/00 16/342 |

(Continued)

FOREIGN PATENT DOCUMENTS

CN  201666529 U  12/2010
TW  M306017 U  2/2007

*Primary Examiner* — Nkeisha Smith
(74) *Attorney, Agent, or Firm* — Zhigang Ma

(57) ABSTRACT

A support device for a display includes a support assembly, a rotating assembly, and a fixing assembly. The support assembly includes a base, a plug defined on the base, a support rod coupled to the base, and a first conducting line received in the support rod, and connected to the plug. The rotating assembly includes a connecting member coupled to the support rod, a rotating shaft connected to the connecting member, and a second conducting line received in the rotating shaft. The second conducting line is electrically connected to the first conducting line by the connecting member. The fixing assembly includes a fixing block fastened to the rotating shaft away from the base, a conducting block assembled to the fixing block and electrically connected to the second conducting line, and a rotating member rotationally connected to the fixing block.

20 Claims, 8 Drawing Sheets

(56) References Cited

U.S. PATENT DOCUMENTS

2012/0228441 A1\* 9/2012 Ceron ................... F16M 11/24
248/125.7

\* cited by examiner

SUPPORT DEVICE FOR A DISPLAY DEVICE

FIELD

The subject matter herein generally relates to a support device, and particularly to a support device for a display device.

BACKGROUND

Generally, a display device refers to monitors for devices, such as televisions or computers, that display a picture employing a cathode ray tube (CRT), a liquid crystal display (LCD), a plasma display panel (PDP) or a similar display device. For example, an LCD monitor includes a main body displaying the picture through an LCD panel, a base part supporting the main body, and a stand part provided between the main body and the base part.

BRIEF DESCRIPTION OF THE DRAWINGS

Implementations of the present technology will now be described, by way of example only, with reference to the attached figures.

DETAILED DESCRIPTION

Figure 1:
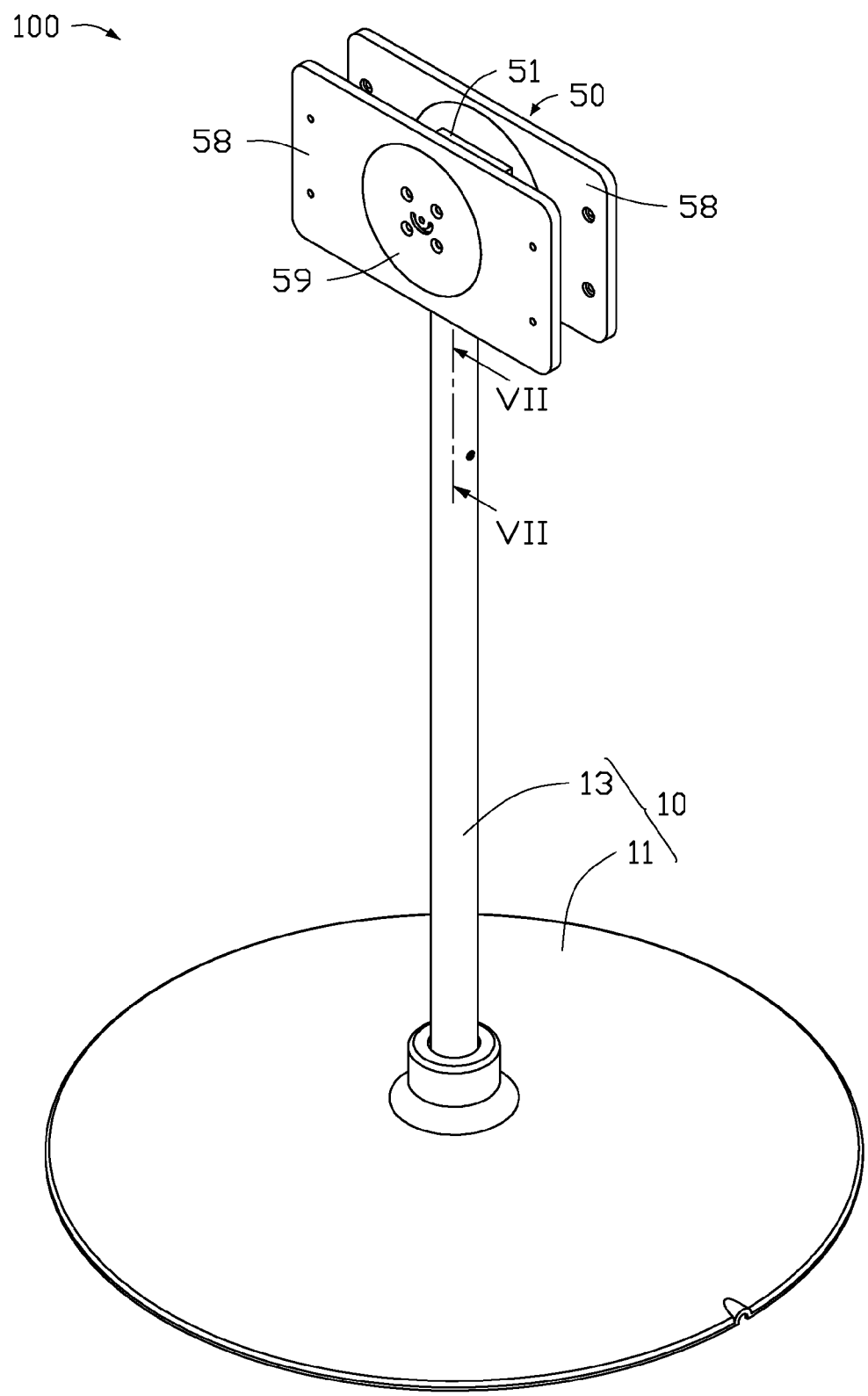
FIG. 1 is an isometric view of an embodiment of a support device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "inside" indicates that at least a portion of a region is partially contained within a boundary formed by the object. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising", when utilized, means "including, but not necessarily limited to"; it specifically indicates open-ended inclusion or membership in the so-described combination, group, series and the like.

The present disclosure is described in relation to a support device for a display device.

FIG. 1 illustrates an isometric view of an embodiment of a support device 100. The support device 100 can be configured to support and hold a display device (not shown) in position, and includes a support assembly 10, a rotating assembly 30 (shown in FIG. 3) assembled to the support assembly 10, and a fixing assembly 50 connected to the support assembly 10 and the rotating assembly 30. The rotating assembly 30 can be received in the support assembly 10, and rotate relative to the support assembly 10. The display device can be tilted to an angle by the fixing assembly 50.

Figure 2:
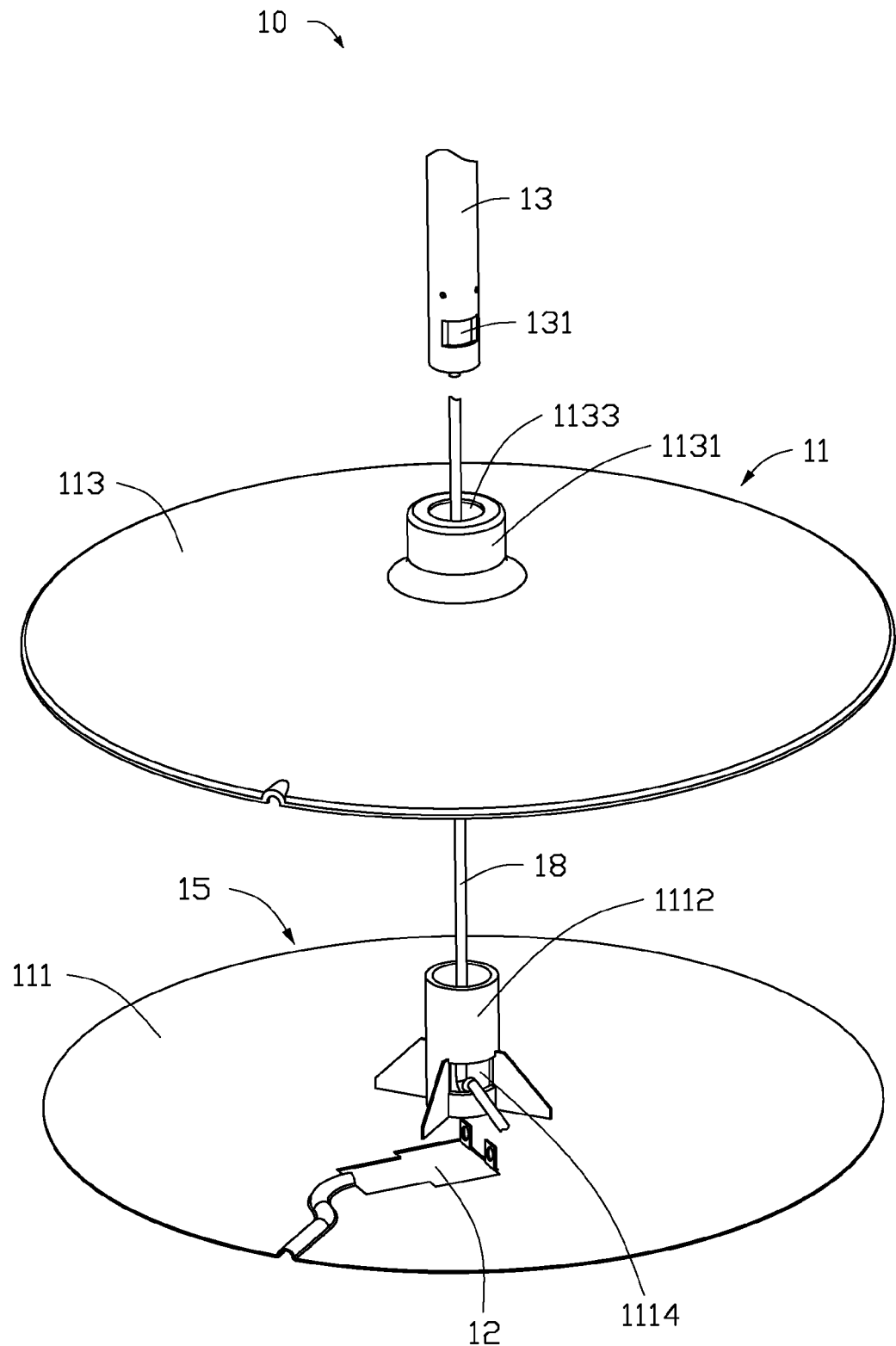
FIG. 2 is an exploded, isometric view of a base of the support device as shown in FIG. 1.

FIG. 2 illustrates an exploded, isometric view of a base 10 of the support device. The support assembly 10 can include a base 11 and a support rod 13 assembled to the base 11. The base 11 can be substantially circular disk-shaped, and can define a plug 12. In operation, the plug 12 can be connected to power (not shown). The base 11 can include a circular bezel plate 111 and a connecting plate 113, and the circular bezel plate 111 can be covered by the connecting plate 113. A size of the bezel plate 111 can be equal to that of the connecting plate 113. A receiving cavity 15 can be formed between the bezel plate 111 and the connecting plate 113. The plug 12 can be defined on a sidewall of the bezel plate 111 away from the connecting plate 113, and the plug 12 can be connected to the receiving cavity 15.

The support assembly 10 can define a first conducting line 18, one end of the first conducting line 18 can be connected to power (not shown), and the other one can be connected to the receiving cavity 15. The bezel plate 111 can define a connecting portion 1112 towards the connecting plate 113, and the connecting portion 1112 can be substantially hollow cylinder. An opening 1114 can be defined on a sidewall of the connecting portion 1112. The first conducting line 18 can enter into the inside of the connecting portion 1112 via the opening 1114. A pivot portion 1131 can be defined on a surface of the connecting plate 113 away from the bezel plate 111, and a pivot hole 1133 can be defined on the pivot portion 1131. The connecting portion 1112 can be surrounded by the pivot portion 1131, and the pivot portion 1131 can be configured to connect to the support rod 13.

The support rod 13 can be a substantially hollow cylinder. A notch 131 can be defined around a sidewall of the support rod 13, and the notch 131 can be connected to an inside of the support rod 13. The support rod 13 can pass through the pivot hole 1133 of the pivot portion 1131, and plug into the connecting portion 1112. In this situation, the notch 131 can be aligned with the opening 1114, the first conducting line 18 can pass through the opening 1114 and the notch 131, and extend to inside of the support rod 13. In other embodiments, a power plug (not shown) can be connected to one end of the first conducting line 18 close to the base 11.

Figure 3:
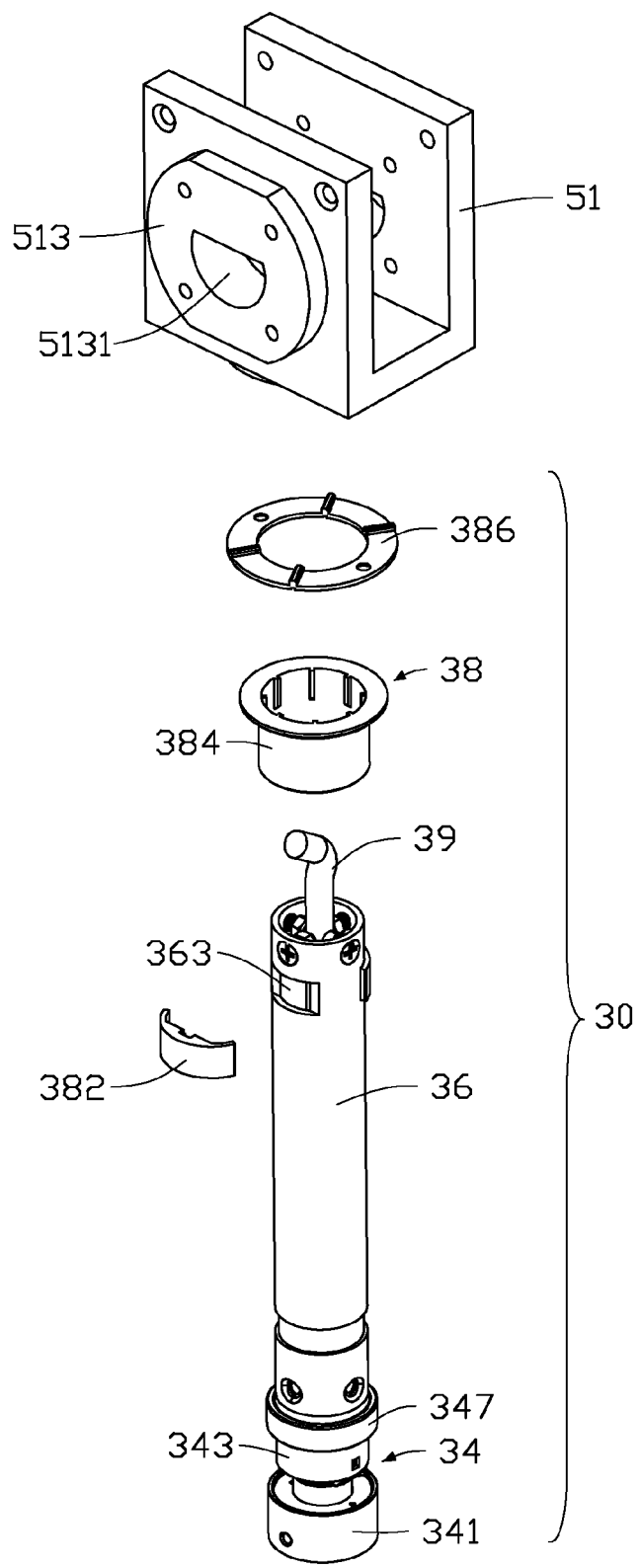
FIG. 3 is an exploded, isometric view of a rotating assembly of the support device as shown in FIG. 1.

FIG. 3 illustrates an exploded, isometric view of a rotating assembly 30 of the support device 100. The rotating assembly 30 can include a connecting member 34 received in the support rod 13, a rotating shaft 36 connected to the connecting member 34, a controlling member 38 assembled to rotating shaft 36; and a second conducting line 39 received in the rotating shaft 36.

Figure 4:
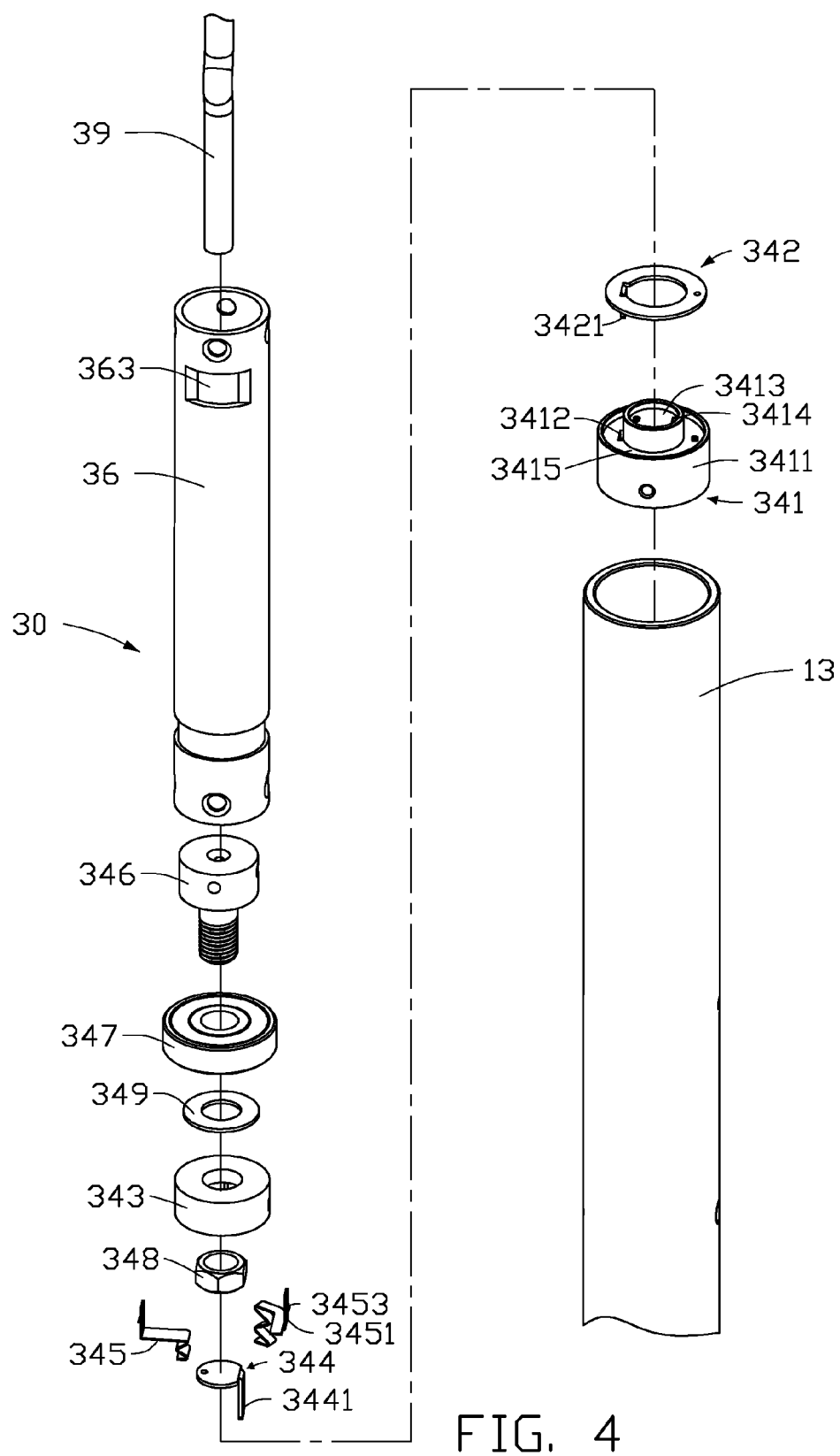
FIG. 4 is an exploded, partially isometric view of the support device as shown in FIG. 1.

FIG. 4 illustrates an exploded, partially isometric view of the support device 100. The connecting member 34 can include a carrier 341, a first fixing washer 342, a support bracket 343, a second fixing washer 344, a pair of elastic members 345, a bearing base 346, a bearing 347, a nut 348, and a first pad 349. The carrier 341 can be substantially cylindrical, and can be connected to an inside of the support rod 13. The carrier 341 can include a fastening portion 3411, and a shoulder 3413 protruding from the fastening portion 3411. The fastening portion 3411 can be assembled to the inside of the support rod 13, and include a receiving portion 3415. A first groove 3412 can be defined on a bottom of the receiving portion 3415, the shoulder 3413 can define a second groove 3414 away from the first groove 3412, and both the first groove 3412 and the second groove 3414 can be substantially bar-shaped.

The first fixing washer 342 can be substantially ring-shaped, assembled to the fastening portion 3411 of the carrier 341 and can pass through the shoulder 3413, and can be received in the receiving portion 3415. The first fixing washer 342 can define a first latching portion 3421 close to the carrier 341, and the first latching portion 3421 can be coupled to the first groove 3412. The second fixing washer 344 can also be substantially ring-shaped, and assembled to the shoulder 3413 and can define a second latching portion 3441 close to the carrier 341, and the second latching portion 3441 can be coupled to the second groove 3414. In the illustrated embodiment, both the first fixing washer 342 and the second fixing washer 344 can be made of conductive material, the first latching portion 3421 can be connected to the first conducting line 18 through the first groove 3412, and the second latching portion 3441 can be connected to the first conducting line 18 through the second groove 3414.

Figure 5:
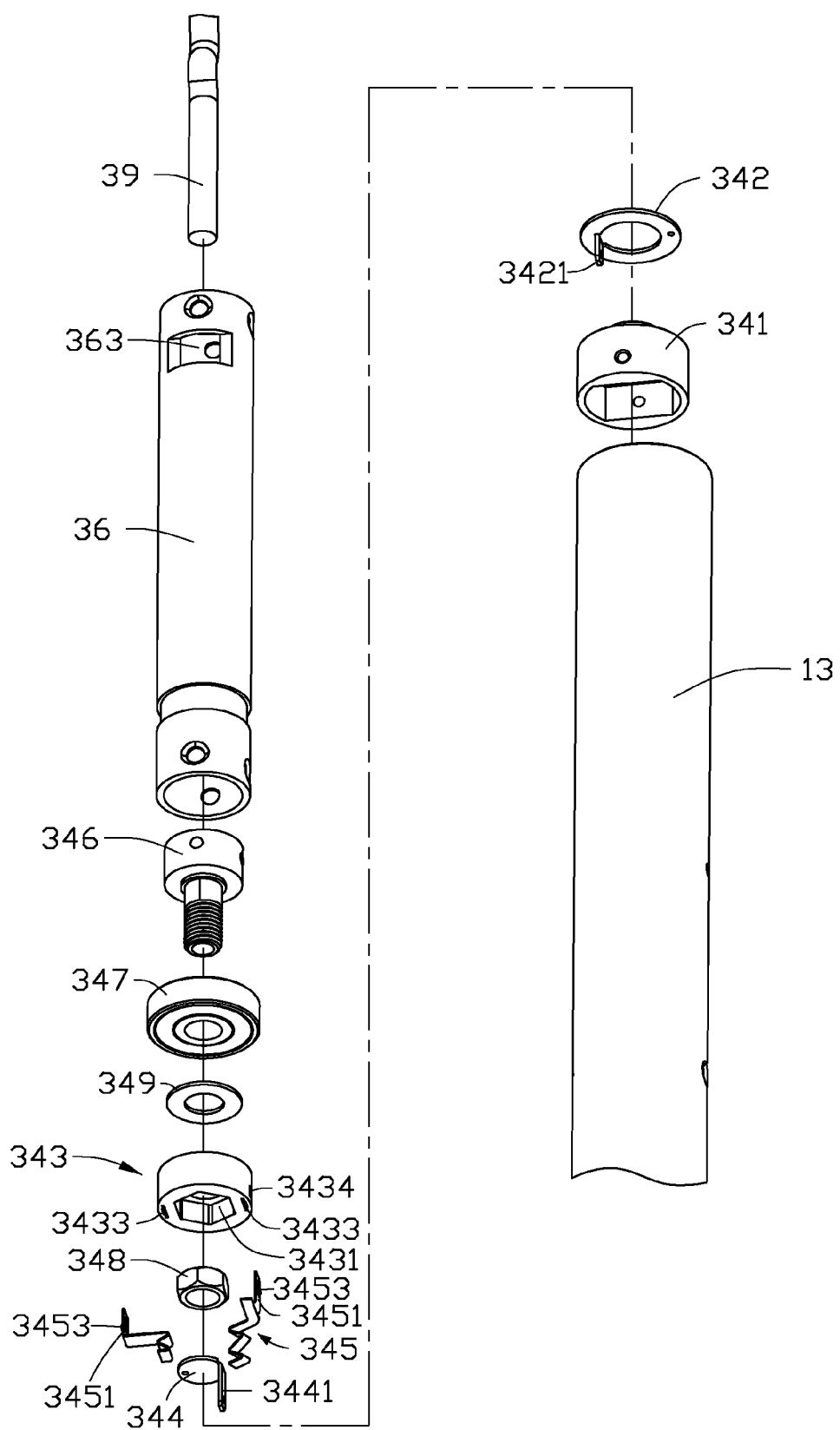
FIG. 5 is an exploded, isometric view as shown in FIG. 4, but viewed from another angle.

FIG. 5 illustrates an exploded, isometric view as shown in FIG. 4, but viewed from another angle. The support bracket 343 and the pair of elastic members 345 can be positioned on the carrier 341. The support bracket 343 can be substantially annular, and define an indentation 3431, a pair of opposite limiting grooves 3433, and a pair of limiting holes 3434. The indentation 3431 and the pair of opposite limiting grooves 3433 can be close to the carrier 341, and the pair of limiting holes 3434 can be defined on the sidewall of the support bracket 343, and can be coupled to the limiting grooves 3433. In the illustrated embodiment, a length of one elastic member 345 can be different from that of the other elastic member 345. Each elastic member 345 can include a limiting portion 3451 and a clasp 3453, the limiting portion 3451 can be received in and corresponds to one of the limiting grooves 3433, and the clasp 3453 can be received in and corresponds to one of the limiting holes 3434. One elastic member 345 can resist against the first fixing washer 342 (shown in FIG. 4), and the other elastic member can resist against the second fixing washer 344 (shown in FIG. 4).

The bearing 347 can be a substantially hollow cylinder, and can be assembled to the bearing base 346. A sidewall of the bearing 347 can abut an inner surface of the support rod 13. In the illustrated embodiment, the bearing base 346 can be a bolt-shaped and can pass through the bearing 347 and the support bracket 343. The nut 348 can be received in the indentation 3431, and can be engaged with the bearing base 346. The bearing 347 can be assembled to the support bracket 343 by the bearing base 346 and the nut 348. The first pad 349 can be sandwiched between the support bracket 343 and the bearing 347.

The rotating shaft 36 can be substantially hollow cylinder. The rotating shaft 36 can be received in the support rod 13, and can be connected to the bearing base 346. The rotating shaft 36 can rotate the bearing base 346, the support bracket 343, the bearing 347, and the pair of elastic members 345. In the illustrated embodiment, the rotating shaft 36 can include a pair of opposite assembly grooves 363.

Figure 6:
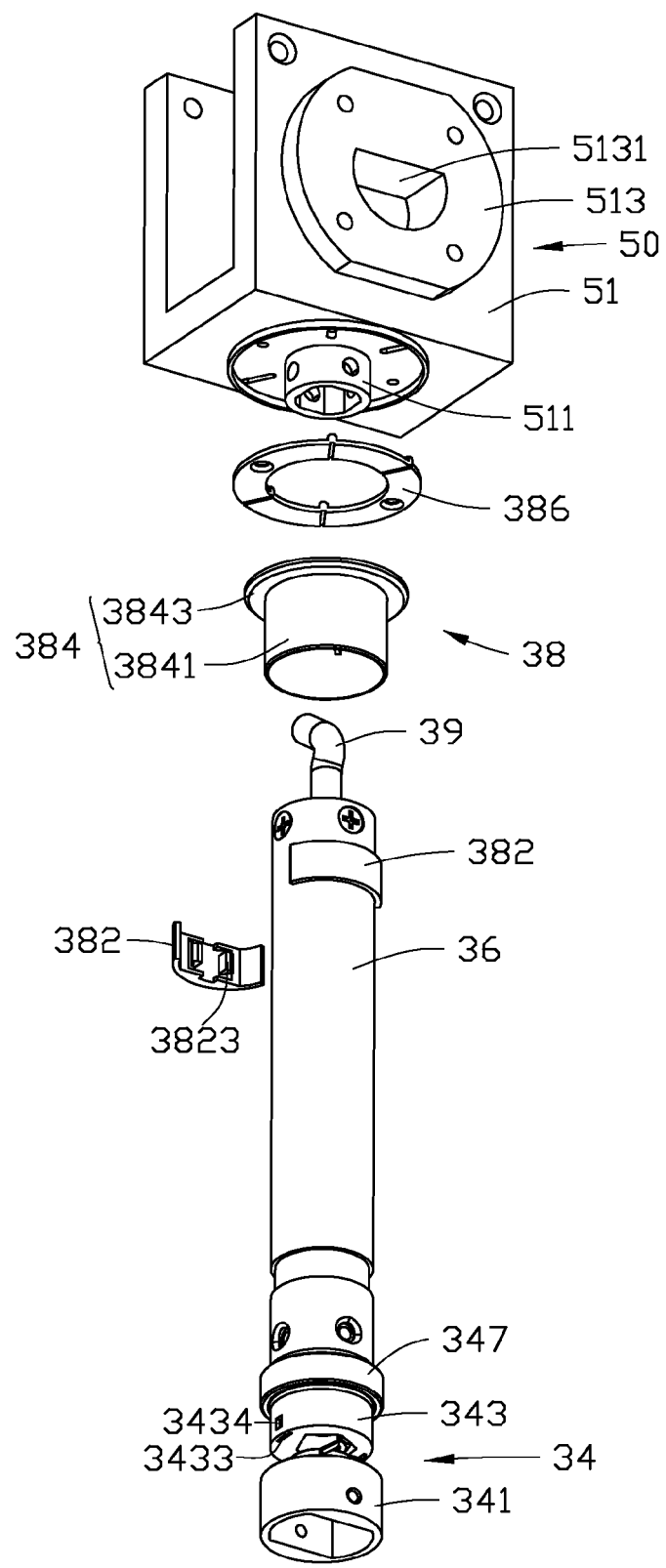
FIG. 6 is an exploded, isometric view of a rotating assembly of the support device as shown in FIG. 3, but viewed from another angle.

FIG. 6 illustrates another exploded, isometric view of a rotating assembly 36 of the support device 100. The controlling member 38 can be assembled to the end of the rotating assembly 36 away from the connecting member 34, and include a pair of friction blocks 382, a friction cylinder 384, and a first friction washer 386. A cross section of each friction block 382 can be substantially semicircular, and the pair of friction blocks 382 can be assembled to the pair of opposite assembly grooves 363 (shown in FIG. 5). Each friction block 382 can abut to an inner surface of the friction cylinder 384, and define a pair of first resisting portions 3823 away from the inner surface of the friction cylinder 384. The friction cylinder 384 can be a substantially hollow cylinder, including a main body 3841 received in the support rod 13 (shown in FIG. 5), and a second resisting portion 3843 protruding from the main body 3841. An end of the rotating assembly 36 can be received in the main body 3841; the second resisting portion 3843 can press against an end of the support rod 13. The first friction washer 386 can be substantially annular, and can be assembled to the second resisting portion 3843 of the friction cylinder 384. There is a frictional resistance generated between the friction cylinder 384 and the first friction washer 386, which can prevent the rotating assembly 36 from abrasion.

The fixing assembly 50 can include a fixing block 51 assembled to the rotating assembly 36. The fixing block 51 can be substantially U-shaped, and can be positioned on the first friction washer 386. The fixing block 51 can include a connecting portion 511, and the connecting portion 511 can be connected to the rotating assembly 36. The fixing block 51 can be substantially hollow cylinder, and the second conducting line 39 can pass through the fixing block 51. The fixing block 51 can further include a pair of opposite extending portions 513, and each extending portion 513 can define a receiving hole 5131.

Figure 7:
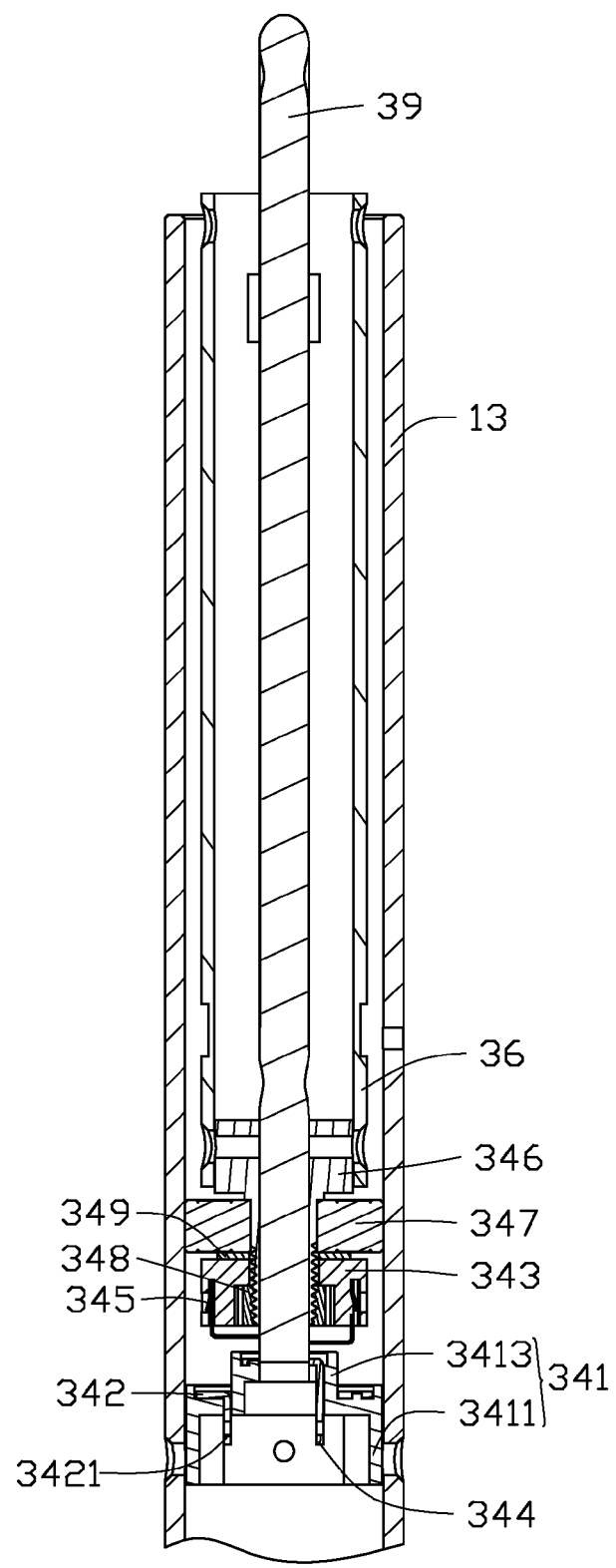
FIG. 7 is a cross-sectional view of the support device taken along line VII-VII of FIG. 1.

FIG. 7 illustrates a cross-sectional view of the support device 100. A part of the second conducting line 39 can be received in the rotating assembly 36. An end of the second conducting line 39 can pass through the bearing base 346, and can be connected to an elastic member 345. A sidewall of the second conducting line 39 can be the other elastic member 345. The second conducting line 39 can be electrically connected to the first conducting line 18 by the elastic members 345, the first latching portion 342, and the second fixing washer 344.

Figure 8:
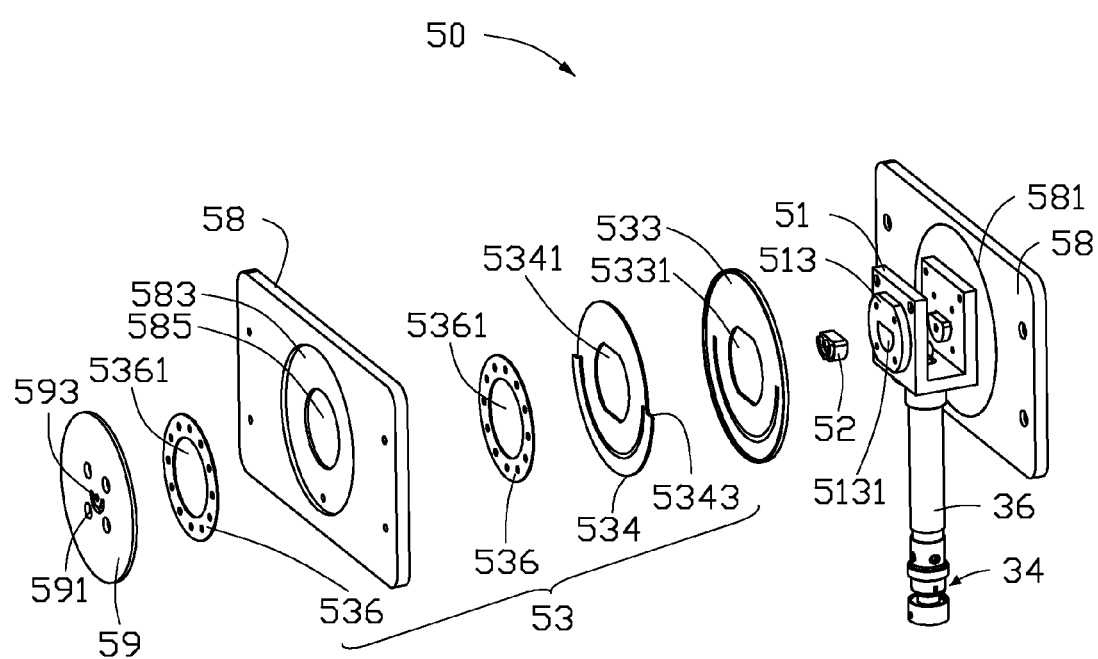
FIG. 8 is an exploded, isometric view of a fixing assembly of the support device as shown in FIG. 1.

FIG. 8 illustrates an exploded, isometric view of a fixing assembly 50 of the support device 100. The fixing assembly 50 can further include a conducting block 52, a rotating member 53 assembled to the fixing block 51, a pair of fixing plates 58, and a pair of locking washers 59. The conducting block 52 can be received in the receiving hole 5131; the second conducting line 39 (shown in FIG. 7) can extend away from the rotating assembly 36, and can be connected to the conducting block 52. The rotating member 53 can include a pair of second pads 533, a pair of limiting washers 534, and four second friction washers 536. The pair of second pads 533, the pair of limiting washers 534, and the four second friction washers 536 can be symmetrically positioned on two sides of the fixing assembly 50.

A fastening hole 5331 can be defined on the center of each second pad 533, a shape and size of the fastening hole 5331 can be the same as that of the extending portion 513, and one of the extending portions 513 can be correspondingly coupled to the fastening hole 5331. A first through hole 5341 can be defined on a center of the limiting washer 534, a shape and size of the first through hole 5341 can be the same as that of the extending portion 513, and one of the extending portions 513 can be correspondingly coupled to the first through hole 5341. A pair of protuberances 5343 can be respectively defined on two peripheral edges of two limiting washers 534.

Each second friction washer 536 can define a shaft hole 5361 coupled to one of the extending portions 513, and each second friction washer 536 can be assembled to the fixing block 51 by the shaft hole 5361. Each second friction washer 536 can be adjacent to the corresponding limiting washer 534, and rotate relative to the fixing block 51. There is a frictional resistance between the limiting washer 534 and the second friction washer 536, thereby a relative position between the limiting washer 534 and the second friction washer 536 can be freely positioned.

Each fixing plate 58 can be assembled to the fixing block 51, and include a first recessed portion 581 close to the fixing block 51 and a second recessed portion 583 away from the fixing block 51. One of the second pads 533, one of the limiting washers 534, and two of the four second friction washers 536 can both be received in the first recessed portion 581. An assembly hole 585 can be defined on a center of the fixing plate 58 and corresponds to one of the extending protions 513, and the conducting block 52 can pass through the assembly hole 585. The display device (not shown) can be fastened on the fixing plate 58, and the fixing plate 58 and the second friction washer 536 can rotate relative to the fixing block 51. Each locking washer 59 can be assembled to and corresponds to one of the extending portions 513 of the fixing block 51, and can be rotationally connected to the fixing plate 58 by the second friction washer 536. Each locking washer 59 can be substantially circular, and include a locking hole 591 and a second through hole 593. The second through hole 593 can be coupled to the conducting block 52.

In assembly, the first fixing washer 342 and the second fixing washer 344 can be assembled to the carrier 341, the pair of elastic members 345 can be assembled to the support bracket 343, and the ends of the pair of elastic members 345 can respectively resist against the first fixing washer 342 and the second fixing washer 344. Then, the bearing 347 can be assembled to the bearing base 346, and the bearing base 346 can be assembled to the support bracket 343. The nut 348 can be connected to the bearing base 346, and received in the indentation 3431. The second conducting line 39 can be received in the rotating shaft 36, the rotating shaft 36 can be assembled to the bearing base 346. The friction block 382 can be assembled to the rotating shaft 36, the friction cylinder 384 can surround the rotating shaft 36, and the first friction washer 386 can be assembled to the friction cylinder 384. The first conducting line 18 can be received in the support rod 13, the carrier 341 can be fastened on the support rod 13, and the rotating shaft 36 can be received in the support rod 13. The support rod 13 can be assembled to the base 11; the first conducting line 18 can extend toward the plug 12. The fixing block 51 can be assembled to the rotating shaft 36, the conducting block 52 can be received in the fixing block 51, and the second conducting line 39 can be electrically connected to the conducting block 52. At last, the second pad 533, the limiting washer 534, the second friction washer 536, the fixing plate 58, and the locking washer 59 can be assembled to the fixing block 51 in turn.

In operation, the base 11 can be positioned on a platform (not shown), the plug 12 can be electrically connected to power (not shown). Then, an electric energy of power can be transmitted to the display device by the first conducting line 18, the elastic members 345, the second conducting line 39, and the conducting block 52.

When the display device is needed to be tilted, an operator can rotate the display device to an angle. In this situation, the operator should overcome the frictional resistance generated by the limiting washer 534 and the second friction washer 536. The second friction washer 536, the fixing plate 58, and the display device can rotate together, and the conducting block 52 can be electrically connected to the second conducting line 39 all the time. Because of the friction resistance, the display device can be positioned at any inclined angle.

The display device can rotate on the rotating assembly 36. In this situation, the second conducting line 39 can be electrically connected to the first conducting line 18 by the elastic member 345, the first fixing washer 342, and the second fixing washer 344. With the interaction of the friction block 382, the friction cylinder 384, and the first friction washer 386, the display device can be positioned at any rotation angle.

The support device 100 includes a rotating assembly 30 and a fixing assembly 50, so the display device can be tilted to different angles, to meet the needs of different people. After the display device is rotated to an angle, the first friction washer 386 and the second friction washer 536 can position the display device. With the interaction of the elastic member 345, the first fixing washer 342, and the second fixing washer 344, the second conducting line 39 can be electrically connected to the first conducting line 18 all the time, which can improve a stability of the support device 100.

The embodiments shown and described above are only examples. Many details are often found in the art such as the other features of a support device for a display device. Therefore, many such details are neither shown nor described. Even though numerous characteristics and advantages of the present technology have been set forth in the foregoing description, together with details of the structure and function of the present disclosure, the disclosure is illustrative only, and changes may be made in the details, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A support device for a display device, the support device comprising:
   a support assembly comprising
      a base,
      a plug defined on the base,
      a support rod coupled to the base, and
      a first conducting line received in the support rod and connected to the plug;
   a rotating assembly comprising
      a connecting member coupled to the support rod,
      a rotating shaft connected to the connecting member, and a second conducting line received in the rotating shaft and being electrically connected to the first conducting line by the connecting member;
a fixing assembly comprising
a fixing block fastened to the rotating shaft away from the base,
a conducting block coupled to the fixing block and electrically connected to the second conducting line, and
a rotating member rotationally connected to the fixing block;
wherein, the rotating shaft is configured to drive the fixing assembly to rotate relative to a central axis of the rotating shaft;
the rotating member is configured to rotate relative to the fixing block; and
the first conducting line, the connecting member, the second conducting line, and the conducting block are connected with each other.

2. The support device as claimed in claim 1, wherein the connecting member comprises a carrier, a first fixing washer, a support bracket; a second fixing washer, and a pair of elastic members.

3. The support device as claimed in claim 2, wherein the carrier is assembled to the support rod, and comprises a fastening portion and a shoulder protruding from the fastening portion.

4. The support device as claimed in claim 3, wherein the fastening portion is assembled to an inside of the support rod, and comprises a receiving portion, a first groove being defined on a bottom of the receiving portion, and the shoulder defines a second groove away from the first groove.

5. The support device as claimed in claim 4, wherein the first fixing washer is assembled to the fastening portion of the carrier, the first fixing washer passes through the shoulder, and can be received in the receiving portion, the first fixing washer defines a first latching portion close to the carrier, the first latching portion is coupled to the first groove, and the first latching portion is connected to the first conducting line through the first groove.

6. The support device as claimed in claim 4, wherein the second fixing washer is assembled to the shoulder, defines a second latching portion close to the carrier, the second latching portion is coupled to the second groove, and the second latching portion is connected to the first conducting line through the second groove.

7. The support device as claimed in claim 2, wherein the support bracket and the pair of elastic members are positioned on the carrier, the support bracket comprises an indentation, a pair of limiting grooves, and a pair of limiting holes, the indentation and the pair of limiting grooves are close to the carrier, and the pair of limiting holes is defined on a sidewall of the support bracket, and coupled to the limiting grooves.

8. The support device as claimed in claim 7, wherein each elastic member comprises a limiting portion and a clasp, the limiting portion is received in and corresponds to one of the limiting grooves, the clasp is received in and corresponds to one of the limiting holes, one elastic member resists against the first fixing washer, and the other elastic member resists against the second fixing washer.

9. The support device as claimed in claim 8, wherein the connecting member further comprises a bearing base, a bearing assembled to the bearing base, a nut, and a first pad, a sidewall of the bearing abuts to an inner surface of the support rod, the nut is received in the indentation, and engaged with the bearing base, and the first pad is sandwiched between the support bracket and the bearing.

10. The support device as claimed in claim 9, wherein the rotating shaft is connected to the bearing base, the rotating shaft drives the bearing base, the support bracket, the bearing, and the pair of elastic members to rotate, and the rotating shaft comprises a pair of opposite assembly groove.

11. The support device as claimed in claim 10, wherein the rotating assembly further comprises a controlling member assembled to the rotating assembly away from the connecting member, and the controlling member comprises a pair of friction blocks, a friction cylinder, and a first friction washer.

12. The support device as claimed in claim 11, wherein the pair of friction blocks are assembled to the pair of opposite assembly groove, each friction block abuts to an inner surface of the friction cylinder, and defines a pair of first resisting portions away from the inner surface of the friction cylinder.

13. The support device as claimed in claim 12, wherein the friction cylinder comprises a main body received in the support rod, and a second resisting portion protruding from the main body, an end of the rotating assembly is received in the main body, the second resisting portion presses against the support rod, and the first friction washer is assembled to the second resisting portion.

14. The support device as claimed in claim 12, wherein the fixing block is positioned on the first friction washer, the fixing block comprises a connecting portion connected to the rotating assembly, and a pair of extending portions, and each extending portion defines a receiving hole.

15. The support device as claimed in claim 14, wherein the conducting block is received in the receiving hole, the second conducting line extends away from the rotating assembly, and is connected to the conducting block.

16. The support device as claimed in claim 15, wherein the rotating member comprises a pair of second pads, a pair of limiting washers, and four second friction washers, the pair of second pads, the pair of limiting washers, and the four second friction washers are symmetrically positioned on two sides of the fixing assembly.

17. The support device as claimed in claim 16, wherein a fastening hole is defined on a center of each second pad, one of the extending portions is correspondingly coupled to the fastening hole, a first through hole is defined on a center of each of the limiting washers, one of the extending portions is correspondingly coupled to the first through hole, and a pair of protuberances are respectively defined on two peripheral edges of two limiting washers.

18. The support device as claimed in claim 17, wherein each second friction washer defines a shaft hole coupled to one of the extending portions, and each second friction washer is assembled to the fixing block by the shaft hole.

19. The support device as claimed in claim 18, wherein the fixing assembly further comprises a pair of fixing plates, each fixing plate comprises a first recessed portion close to the fixing block and a second recessed portion away from the fixing block; wherein one of the second pads, one of the limiting washers, and two of the four second friction washers are received in the first recessed portion;
wherein an assembly hole is defined on a center of the fixing plate and corresponds to one of the extending portions; and wherein the conducting block passes through the assembly hole.

20. The support device as claimed in claim 19, wherein the fixing assembly further comprises a pair of locking washers respectively assembled to the pair of the extending portions, each locking washer is rotationally connected to one corresponding fixing plate by one of the four second friction washers, each locking washer comprises a locking hole and a second through hole, and the second through hole is coupled to the conducting block.

* * * * *